US011158641B2

(12) United States Patent
Li et al.

(10) Patent No.: US 11,158,641 B2
(45) Date of Patent: Oct. 26, 2021

(54) ANTIFUSE OTP STRUCTURES WITH HYBRID DEVICES AND HYBRID JUNCTIONS

(71) Applicant: Zhuhai Chuangfeixin Technology Co., Ltd., Zhuhai (CH)

(72) Inventors: Li Li, Femont, CA (US); Zhigang Wang, Fremont, CA (US)

(73) Assignee: Zhuhai Chuangfeixin Technology Co., Ltd., Zhuhai (CN)

( * ) Notice: Subject to any disclaimer, the term of this patent is extended or adjusted under 35 U.S.C. 154(b) by 70 days.

(21) Appl. No.: 16/789,230

(22) Filed: Feb. 12, 2020

(65) Prior Publication Data
US 2021/0249425 A1    Aug. 12, 2021

(51) Int. Cl.
*H01L 27/112* (2006.01)
*H01L 27/11502* (2017.01)

(52) U.S. Cl.
CPC .. *H01L 27/11206* (2013.01); *H01L 27/11246* (2013.01); *H01L 27/11502* (2013.01)

(58) Field of Classification Search
CPC ......... H01L 27/11206; H01L 27/11502; H01L 27/11246
See application file for complete search history.

(56) References Cited

U.S. PATENT DOCUMENTS

| 6,667,902 B2 | 12/2003 | Peng |
| 6,671,040 B2 | 12/2003 | Fong |
| 6,798,693 B2 | 9/2004 | Peng |
| 6,822,888 B2 | 11/2004 | Peng |
| 7,402,855 B2 | 7/2008 | Kurjanowiez |
| 8,283,751 B2 | 10/2012 | Kurjanowicz |
| 2007/0008800 A1* | 1/2007 | Jenne ................ G11C 29/028 365/225.7 |

FOREIGN PATENT DOCUMENTS

CN        104681558 A      6/2015

* cited by examiner

*Primary Examiner* — Selim U Ahmed
(74) *Attorney, Agent, or Firm* — SV Patent Service (57) ABSTRACT

An antifuse One-Time-Programmable memory cell includes a substrate, a select transistor formed on the substrate, and an antifuse capacitor formed on the substrate. The select transistor includes a first gate dielectric layer formed on the substrate, a first gate formed on the gate dielectric layer, a first high-voltage junction formed in the substrate, and a second high-voltage junction formed in the substrate. A source and a drain for the select transistor are formed by the first high-voltage junction and the second high-voltage junction. The antifuse capacitor includes a second gate dielectric layer formed on the substrate, a second gate formed on the gate dielectric layer, a third high-voltage junction formed in the substrate, and a fourth high-voltage junction formed in the substrate. A source and a drain for the antifuse capacitor are respectively formed by the third high-voltage junction and the fourth high-voltage junction.

18 Claims, 10 Drawing Sheets

ANTIFUSE OTP STRUCTURES WITH HYBRID DEVICES AND HYBRID JUNCTIONS

BACKGROUND OF THE INVENTION

The present invention relates to the technical field of semiconductor memory, and in particular, to One Time Programmable (OTP) memory.

Embedded Non-Volatile Memory (ENVM) technology has been employed in a number of applications such as post silicon tuning, memory repair, on-line field test, and secure ID storage. ENVM is also a critical component for self-healing applications in which information regarding time dependent failure mechanisms such as circuit aging must be retained during system power off periods. Anti-Fuse One Time Programmable (AF-OTP) NVM memory has been extensively used for memory repair in standard logic processes.

An antifuse is non-conductive in the native unprogrammed state and becomes conductive when programmed, hence the name antifuse. In integrated circuit, antifuse is commonly constructed with a thin dielectric layer sandwiched between two conductors. To program an antifuse, a high voltage is applied between the two conductors. This leads to a physical and permanent breakdown of the thin dielectric layer and the formation of a current conduction path between the two conductors. Antifuse can thus be used as a memory element. Programmed state of an antifuse represents data "1" and unprogrammed state "0" or vice versa. Once programmed, antifuse memory cannot revert to unprogrammed state, i.e., it is a one-time programmable (OTP) memory. Antifuse retains conductive or non-conductive state even after the power is turned off, rendering the data non-volatile. As such, antifuse memory is a non-volatile OTP memory.

In order to provide a high voltage to program the antifuse capacitor, the select transistor is usually built with high voltage junctions. However, transistor with high voltage junctions will take more silicon area because wider channel length and width are needed, and the more silicon area will directly correlate to higher cost. On the other hand, the antifuse capacitor is usually built with thinner gate dielectric for easier programming, and low-voltage junctions are usually applied in conjunction with its low-voltage device. However, the low-voltage junctions could impact the programming yield.

There is therefore a need for antifuse OTP memory cells with high structural simplicity, high integration density and high programming yield.

SUMMARY OF THE INVENTION

In view of the above, the present disclosure provides an antifuse OTP memory bit cell that includes an antifuse capacitor and a metal-oxide-semiconductor field-effect-transistor (MOSFET). The MOSFET is a select transistor which is implemented to program or access the antifuse capacitor. A novel memory cell may have a hybrid structure: a low voltage gate dielectric layer and a high voltage junction, for improved programming yield. A novel select transistor is provided, which includes a high voltage gate dielectric layer and a low voltage junction, for both high voltage programming and smaller silicon area.

In one general aspect, the present invention relates to an antifuse One-Time-Programmable memory cell that includes a substrate, a select transistor formed on the substrate, and an antifuse capacitor formed on the substrate. The select transistor includes a first gate dielectric layer formed on the substrate, a first gate formed on the gate dielectric layer, a first high-voltage junction formed in the substrate, and a second high-voltage junction formed in the substrate. A source and a drain for the select transistor are formed by the first high-voltage junction and the second high-voltage junction. The antifuse capacitor includes a second gate dielectric layer formed on the substrate, a second gate formed on the gate dielectric layer, a third high-voltage junction formed in the substrate, and a fourth high-voltage junction formed in the substrate. A source and a drain for the antifuse capacitor are respectively formed by the third high-voltage junction and the fourth high-voltage junction.

Implementations of the system may include one or more of the following. The third high-voltage junction and the fourth high-voltage junction of the antifuse capacitor can be electrically connected. The first high-voltage junction or the second high-voltage junction or the third high-voltage junction or the fourth high-voltage junction can have a threshold junction breakdown voltage above 3.3 Volt. The first high-voltage junction or the second high-voltage junction or the third high-voltage junction or the fourth high-voltage junction can have a threshold junction breakdown voltage above 5 Volt. The second high-voltage junction and the third high-voltage junction can be electrically connected. The first high-voltage junction can include a first doped region adjacent to the first gate dielectric layer at a lower doped level than a second doped region away from the first gate dielectric layer. The second high-voltage junction can include a first doped region adjacent to the second gate dielectric layer at a lower doped level than a second doped region away from the second gate dielectric layer. The third high-voltage junction can include a first doped region adjacent to the first gate dielectric layer at a lower doped level than a second doped region away from the first gate dielectric layer. The fourth high-voltage junction can include a first doped region adjacent to the second gate dielectric layer at a lower doped level than a second doped region away from the second gate dielectric layer.

In another general aspect, the present invention relates to an antifuse One-Time-Programmable memory cell that includes a substrate; a select transistor formed on the substrate, and an antifuse capacitor formed on the substrate. The a select transistor includes a first gate dielectric layer formed on the substrate, a first gate formed on the gate dielectric layer, a first low-voltage junction formed in the substrate, and a second low-voltage junction formed in the substrate, wherein a source and a drain for the select transistor are formed by the first low-voltage junction and the second low-voltage junction. The antifuse capacitor formed on the substrate includes: a second gate dielectric layer formed on the substrate, a second gate formed on the gate dielectric layer, a first high-voltage junction formed in the substrate, and a second high-voltage junction formed in the substrate, wherein a source and a drain for the antifuse capacitor are respectively formed by the first high-voltage junction and the second high-voltage junction Implementations of the system may include one or more of the following. The first high-voltage junction and the second high-voltage junction of the antifuse capacitor can be separated by a channel in the substrate. The first high-voltage junction and the second high-voltage junction of the antifuse capacitor can be electrically connected. The first high-voltage junction or the second high-voltage junction or the third high-voltage junction or the fourth high-voltage junction can have a threshold junction breakdown voltage above 3.3 Volt. The first high-voltage junction or the second high-voltage junction or the third high-voltage junction or the fourth high-voltage junction can have a threshold junction breakdown voltage above 5 Volt. The first low-voltage junction or the second low-voltage junction can have a threshold junction breakdown voltage below 3.2 Volt. The first high-voltage junction can include a first doped region adjacent to the first gate dielectric layer at a lower doped level than a second doped region away from the first gate dielectric layer. The second high-voltage junction can include a first doped region adjacent to the second gate dielectric layer at a lower doped level than a second doped region away from the second gate dielectric layer. The third high-voltage junction can include a first doped region adjacent to the first gate dielectric layer at a lower doped level than a second doped region away from the first gate dielectric layer. The fourth high-voltage junction can include a first doped region adjacent to the second gate dielectric layer at a lower doped level than a second doped region away from the second gate dielectric layer. These and other aspects, their implementations and other features are described in detail in the drawings, the description and the claims.

BRIEF DESCRIPTION OF THE DRAWINGS

To illustrate the technical solutions of the present invention, the accompanying drawings briefly described embodiments need to be used in describing the embodiments. Obviously, the following drawings only describe examples of the present invention. For those skilled in the art, other drawings may also be obtained according to these drawings without any creative work.

DETAILED DESCRIPTION OF THE INVENTION

The technical solutions in the embodiments of the present invention are described with reference to the accompanying drawings in the embodiments of the present invention.

Figure 1A:
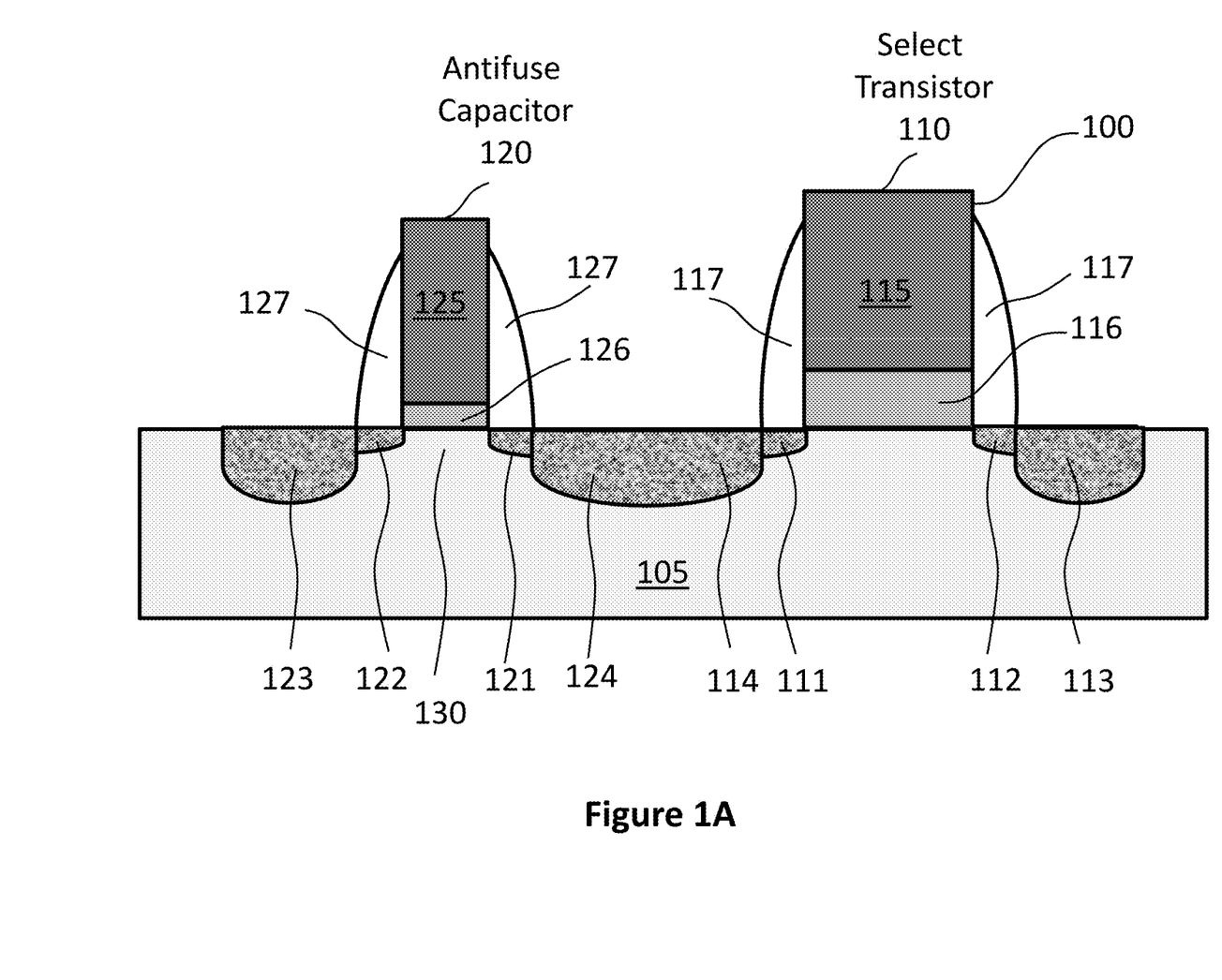
FIG. 1A is a cross-sectional view of an antifuse OTP memory cell having a hybrid antifuse capacitor and a select transistor in accordance with some embodiments of the present invention.
Figure 1B:
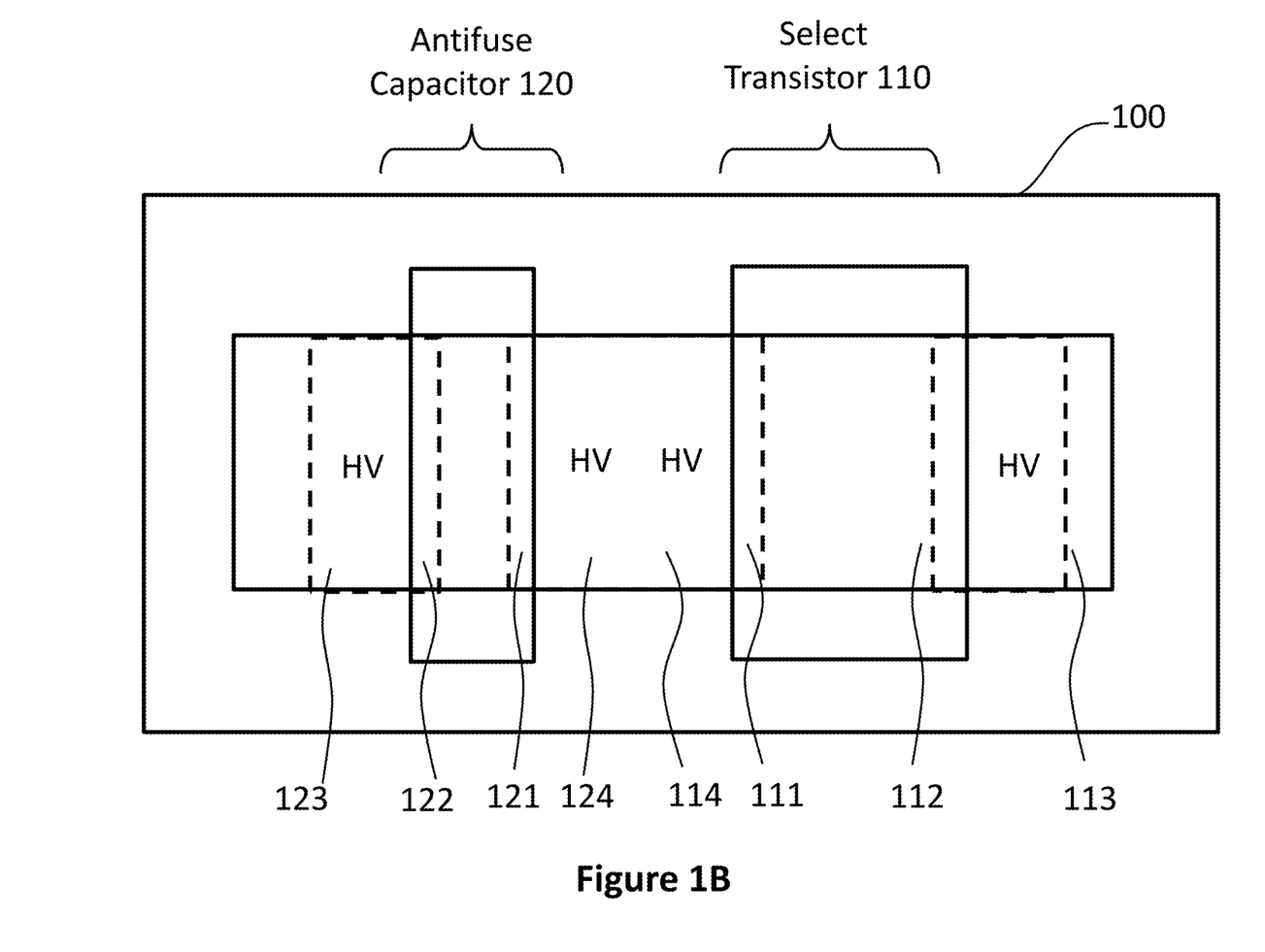
FIG. 1B is a schematic planar drawing of the antifuse OTP memory cell shown in FIG. 1A.

In some embodiments, the antifuse OTP memory uses metal-oxide-semiconductor (MOS) capacitor as the antifuse element. The MOS capacitor is connected to an access device called select transistor, typically a metal-oxide-semiconductor field-effect-transistor (MOSFET) to form a one-transistor one-capacitor (1T1C) antifuse memory bit cell. Referring to FIGS. 1A-1B, an antifuse OTP memory cell 100 includes a select transistor 110 and an antifuse capacitor 120. The select transistor 110 includes a gate 115 on a gate dielectric 116 on a substrate 105.

The antifuse capacitor 120 includes a gate 125 on a gate dielectric 126 on the substrate 105. The junctions (e.g. the source or the drain) of the select transistor 110 are formed respectively by lightly doped regions 111, 112 and the deeply doped regions 113, 114. The two junctions are separated in the substrate 105.

The junctions (e.g. source or drain) of the antifuse capacitor 120 are formed respectively by lightly doped regions 121, 122 and the deeply doped regions 123, 124. The junctions (respectively formed by the doped regions 122, 123 and the doped regions 121, 124) of the antifuse capacitor 120 are separated by a channel 130 and not connected in the substrate 105 (in contrast to the example described in FIGS. 2A and 2B below).

The combination of lightly doped regions 111, 112 and 121, 122 and deeply doped regions 113, 114 and 123, 124 is formed on both sides of the channels by applying the spacer structures 117, 127 between two doping processes.

The source/drain and the gates 115, 125 of the select transistor 110 and the antifuse capacitor 120 are of the same conductivity type. The transistor channel region, i.e., the silicon substrate 105 underneath gate dielectric is of the opposite conductivity type. In the select transistor 110, for example, if the gate 115 and source/drain respectively formed by doped regions 111, 114 and doped regions 112, 113 are N type, the regions of the substrate 105 underneath the gate dielectric 116 is P type. Thus, the source/drain regions form PN junctions with the oppositely doped silicon substrate 105. Similarly, for the antifuse capacitor 120, if the gate 125 and source/drain respectively formed by doped regions 121, 124 and 122, 123 are N type, the region of the substrate 105 underneath the gate dielectric 126 is P type.

The doped regions 111, 112 and 121, 122 are lightly doped, wherein the electrically active concentration of dopant level can be in a range of $3 \times 10^{17} \sim 1 \times 10^{19}$ atoms/cm$^{-3}$. The doped regions 113, 114 and 123, 124 formed on both sides of the channels are deeply doped, wherein the electrically active concentration of dopant level can be above $2 \times 10^{19}$ atoms/cm$^{-3}$.

Doped regions of 113, 112 are connected, and they are electrically conductive. Similarly, doped regions 111, 114, 124, and 121 are connected, and they are electrically conductive. Doped regions 122, 123 are also connected. During antifuse programming, a voltage is applied on the gate 115 to turn on the select transistor 110, i.e., to form a conductive channel in the substrate 105 underneath the gate dielectric 116. In the meantime, a programming voltage is applied to the doped region 113. Through the conductive path underneath the gate dielectric 116, the programming voltage is actually applied on the gate dielectric 126 to cause a dielectric breakdown. A low electrical resistance will be measured between the gate 125 and the doping region 124.

The gate 115 and the gate dielectric 116 in the select transistor 110 support a high-voltage device for high programming yield. The doped regions 111/114 and 112/113 form a high-voltage (HV) junction with the substrate 105 for the select transistor 110. The junction breakdown threshold voltage for HV junctions can be higher than 3.3V, or higher than 5V depending on technology node of the device.

An important aspect of the present disclosure is that although the gate 125 and the gate dielectric 126 in the antifuse capacitor 120 support a low-voltage device, doped regions 122/123 and 121/124 form HV junctions with the substrate 105 for the antifuse capacitor 120. The junction breakdown threshold voltage for HV junctions can be higher than 3.3V, or higher than 5V depending on technology node of the device. The combination of low voltage gate dielectric layer (i.e. an LV device) and a high voltage junction enables the antifuse capacitor 120 to have an improved programming yield.

Since HV junctions are formed for both the antifuse capacitor 120 and the select transistor 110, the deeply doped regions 114 and 124 can be combined to simplify the structure and process. Thus, the HV junction formed by doped regions 111, 114 for the select transistor 110 and the HV junction formed by doped regions 121, 124 for the antifuse capacitor 120 are conductively connected.

In order for transistor to function normally, the junction bias needs to be below junction breakdown voltage. For low voltage transistor, a shallower and steeper junction can be used without causing breakdown. Thus the device can have better short-channel behaviors. Formation of this kind of junction requires shallower implants, lower temperature and shorter anneals. For high-voltage transistor, it is critical to avoid a peak junction electric field that may cause breakdown; therefore the junction profile must be adjusted accordingly. To avoid introducing a very high peak field at the junction, more gradual junction doping profiles are preferred. This usually means deeper implants, longer (maybe multiple) annealing steps. This kind of junctions consequently can handle higher bias voltages.

Figure 1C:
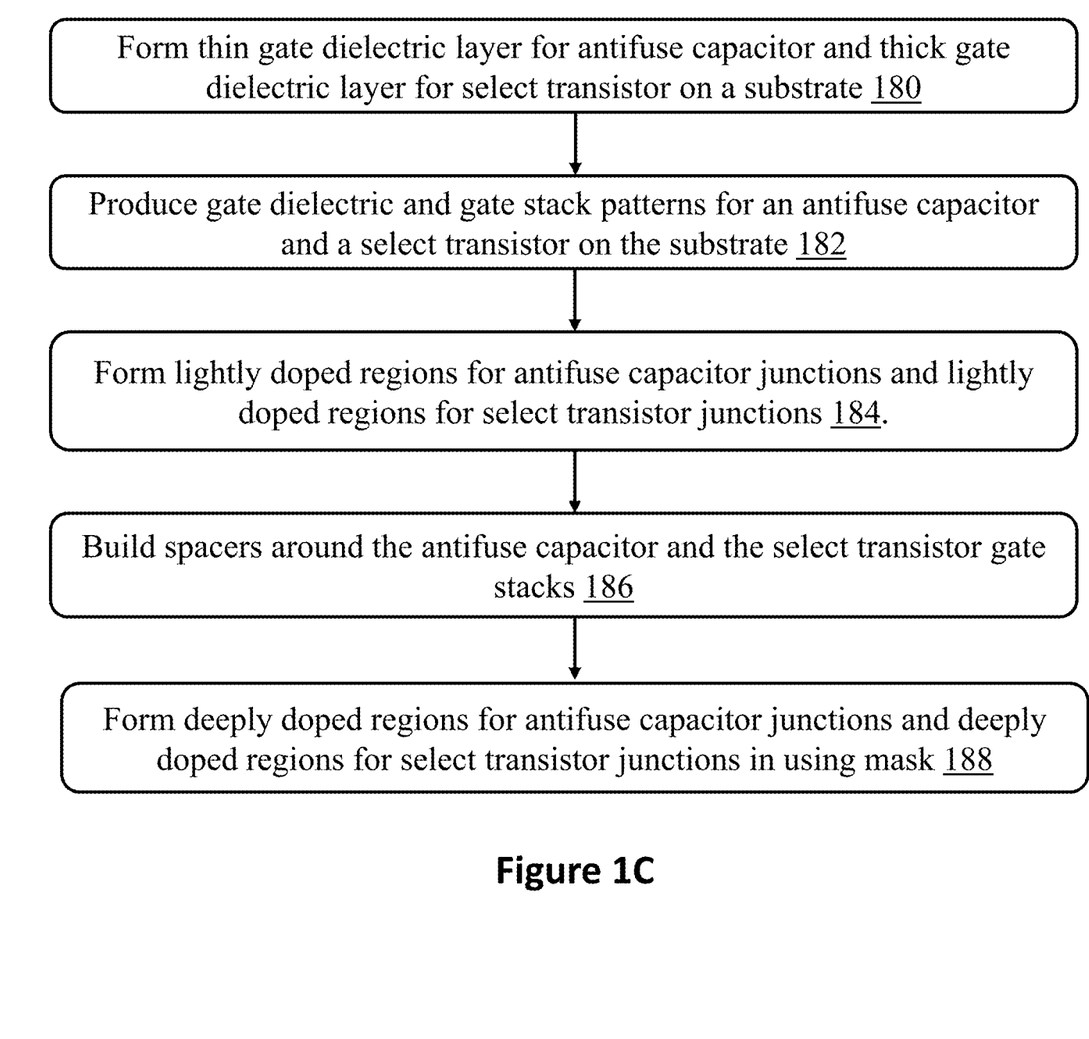
FIG. 1C is a process flow chart to build the antifuse OTP memory cell shown in FIG. 1A.

Referring to FIG. 1C, a process to build the one-transistor one-capacitor (1T1C) antifuse OTP memory cell 100 can include the following steps. First, a gate dielectric layer is formed on a substrate (step 180). Gate dielectric and gate patterns are then produced for an antifuse capacitor and a select transistor on the substrate (step 182). These can be accomplished using masking and etching techniques. A thin gate dielectric layer is formed on the substrate for the antifuse capacitor and a thicker gate dielectric layer is formed on the substrate for the select transistor respectively. Then, the gate stacks are formed on top of the gate dielectric layers. The antifuse capacitor and the select transistor are defined by masking and etching. The combination of lightly doped regions and deeply doped regions is formed by applying the spacer structures 117, 127 between two doping processes.

The relatively shallow doping regions (e.g. 111, 121 in FIGS. 1A and 1B) for the antifuse capacitor 120 and the relatively shallow doping regions (e.g. 112, 122 in FIGS. 1A and 1B) for the select transistor 110 are formed through a single masking and ion implants or separate masking and ion implants (step 184). Moreover, annealing steps maybe added after dopant implant process.

Next, spacers are built around the antifuse capacitor stack and the select transistor gate stack (step 186). Deeply doped regions 113, 114 (FIGS. 1A and 1B) for the select transistor 110, and deeply doped regions 123, 124 (FIGS. 1A and 1B) for the antifuse capacitor 120 are formed in masking process and ion implant (step 188).

The above described only serves as examples of critical process steps to build an antifuse OTP memory cell shown in FIGS. 1A-1B. Additional process steps maybe included between processes steps described above, and other process steps are needed before and after the processes steps described above for building an entire device. For example, in steps 182-188, the source and drain junctions can be formed by ion implantation.

Figure 2A:
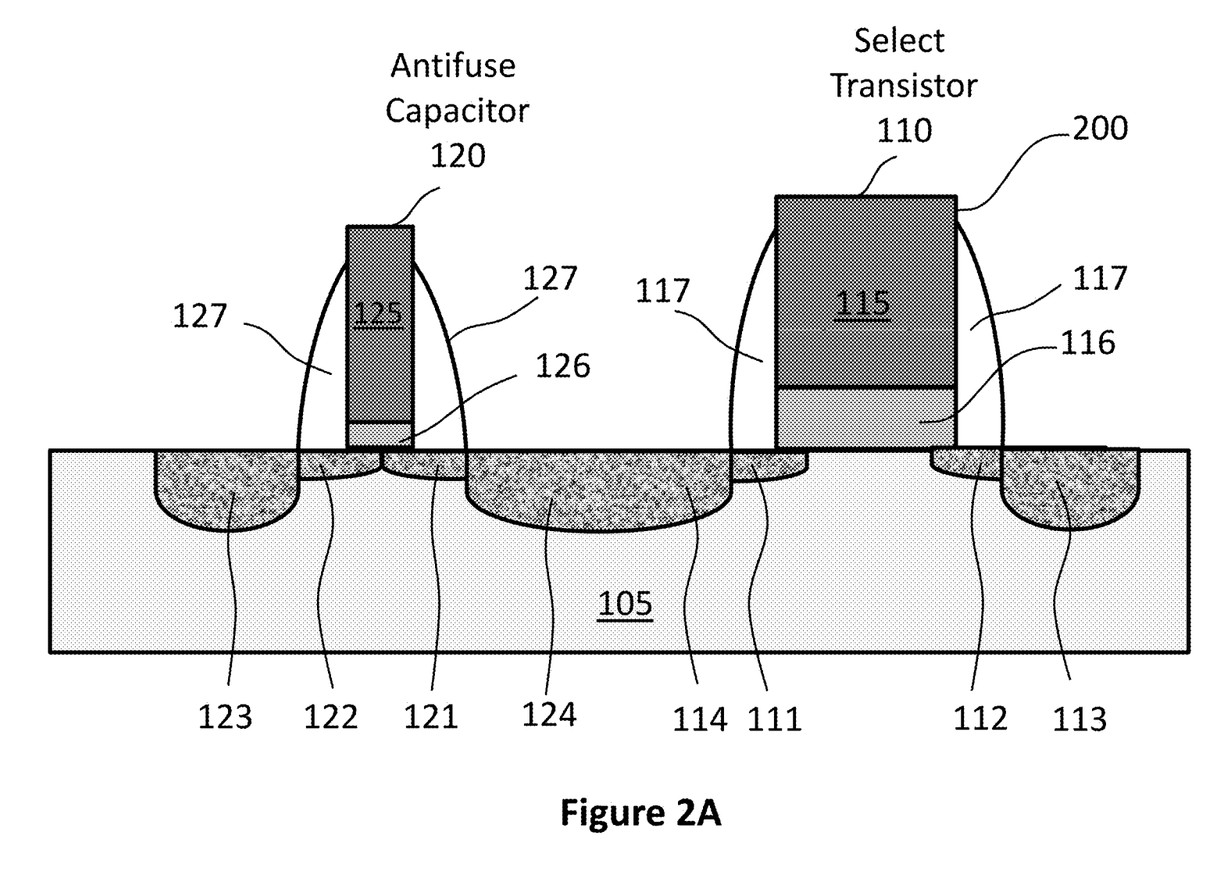
FIG. 2A is a cross-sectional view of another antifuse OTP memory cell related to the antifuse OTP memory cell in FIG. 1A.
Figure 2B:
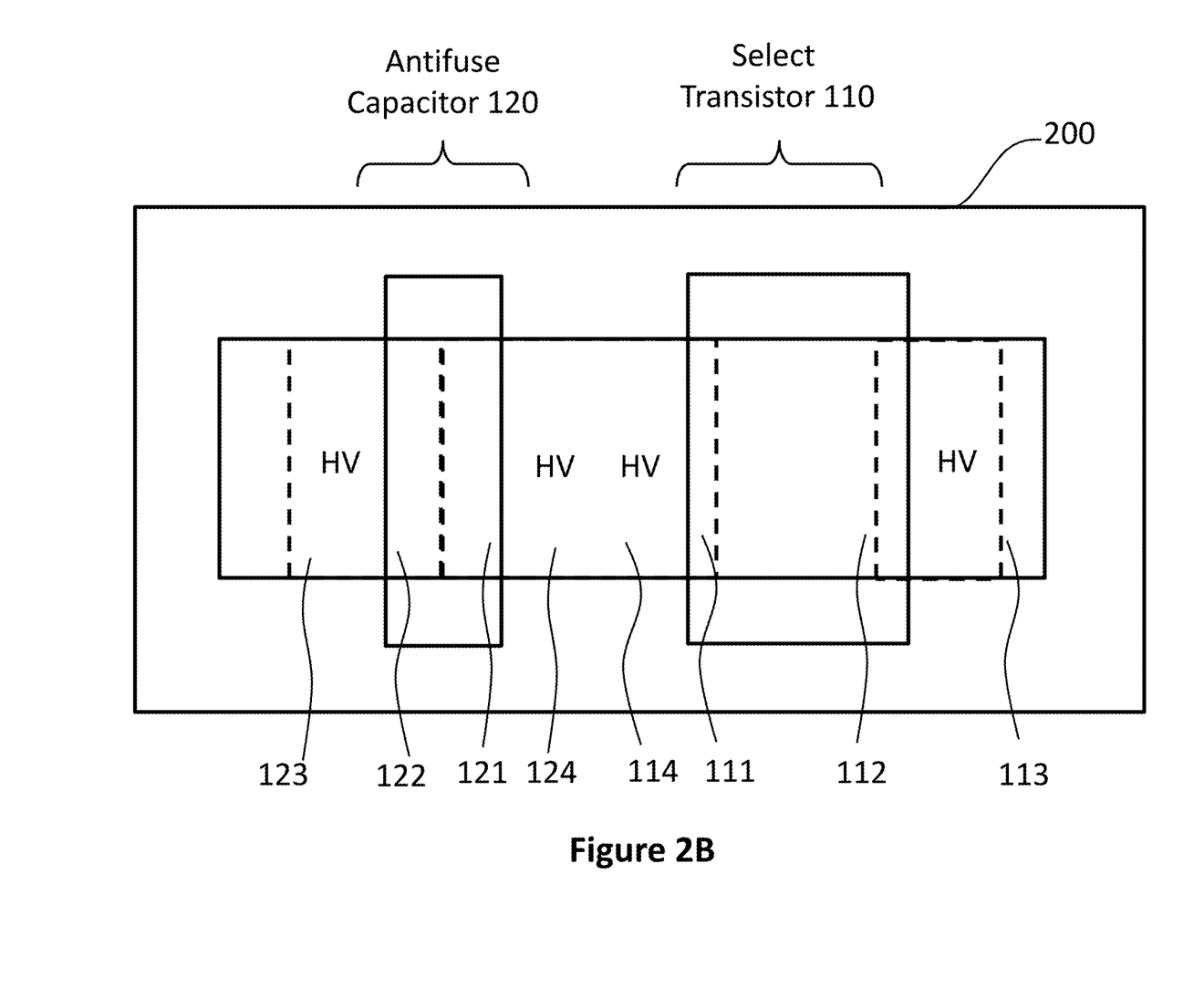
FIG. 2B is a schematic planar drawing of the antifuse OTP memory cell shown in FIG. 2A.

In some embodiments, referring to FIGS. 2A and 2B, an antifuse OTP memory cell 200 includes a select transistor 110 and an antifuse capacitor 120 and associated components, similar to the antifuse OTP memory cell 100 as described above. A difference from the antifuse OTP memory cell 100 is that the lightly doped regions 121, 122 in the antifuse OTP memory cell 200 are electrically connected instead of separated by a channel.

An antifuse is non-conductive in the native unprogrammed state and becomes conductive when programmed. Usually, a voltage is applied on the antifuse capacitor, e.g., between the deeply doped regions 123 and gate 125. An electric current is measured to determine if the antifuse memory cell is programmed or not. However, if the lightly doped regions 121 and 122 are not connected in the substrate 105 underneath the gate oxide 126 (i.e. separated by the channel 130 in FIG. 1A), part of the electric current will leak into the substrate 105 through the channel 130 shown in FIG. 1A; the current measurement will not be stable. By merging the dopant area 121 and 122, the current leakage path into the substrate 105 is blocked, and current measurement noise can be effectively reduced.

Figure 3A:
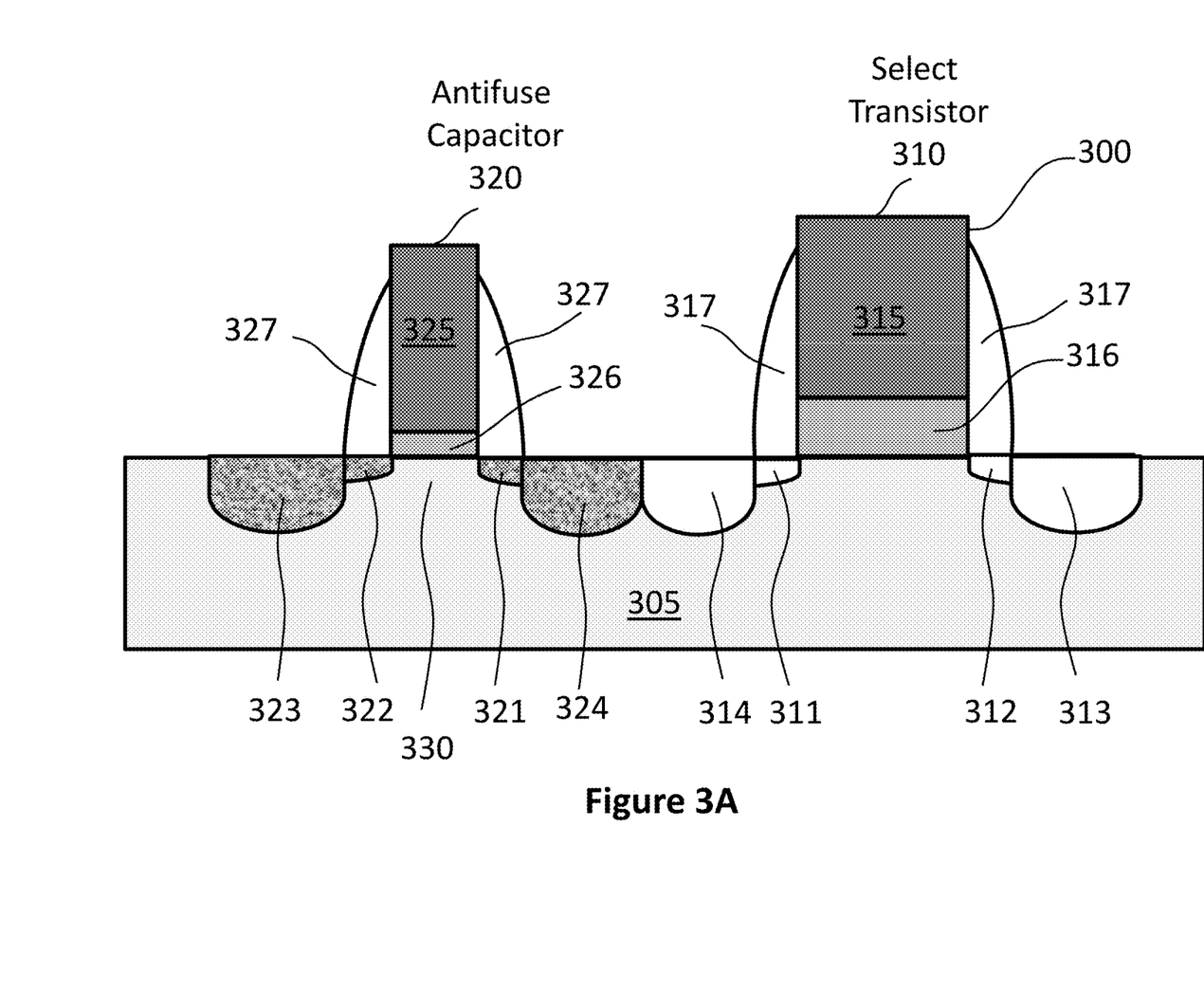
FIG. 3A is a cross-sectional view of an antifuse OTP memory cell having a hybrid antifuse capacitor and a hybrid select transistor in accordance with some embodiments of the present invention.
Figure 3B:
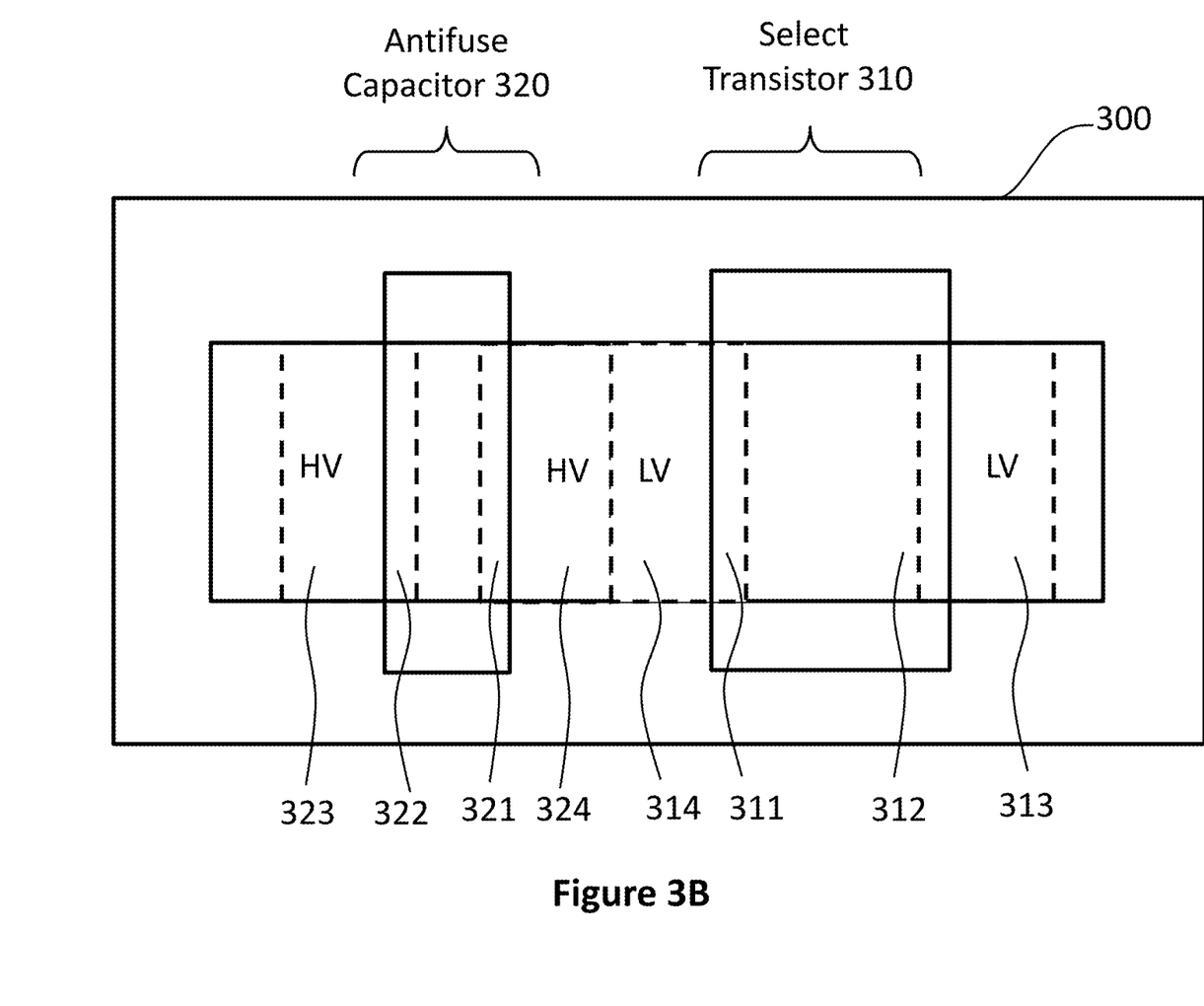
FIG. 3B is a schematic planar drawing of the antifuse OTP memory cell shown in FIG. 3A.

In some embodiments, referring to FIGS. 3A-3B, an antifuse OTP memory cell 300 includes a select transistor 310 and an antifuse capacitor 0320. The select transistor 310 includes a gate 315 on a gate dielectric 316 on a substrate 305.

The antifuse capacitor 320 includes a gate 325 on a gate dielectric 326 on the substrate 305. The junctions (e.g. the source or the drain) of the select transistor 310 are formed respectively by lightly doped regions 311, 312 and the deeply doped regions 313, 314. The two junctions are separated in the substrate 305.

The junctions (e.g. source or drain) of the antifuse capacitor 320 are formed respectively by lightly doped regions 321, 322 and the deeply doped regions 323, 324. The junctions (respectively formed by the doped regions 322, 323 and the doped regions 321, 324) of the antifuse capacitor 320 are separated by a channel 330 and not connected in the substrate 305 (in contrast to the example described in FIGS. 4A and 4B below).

The combination of lightly doped regions 311, 312 and 321, 322 and deeply doped regions 313, 314 and 323, 324 is formed on both sides of the channels by applying the spacer structures 317, 327 between two doping processes.

The source/drain and the gates 315, 325 of the select transistor 310 and the antifuse capacitor 320 are of the same conductivity type. The transistor channel region, i.e., the silicon substrate 305 underneath gate dielectric is of the opposite conductivity type. In the select transistor 310, for example, if the gate 315 and source/drain respectively formed by doped regions 311, 314 and doped regions 312, 313 are N type, the regions of the substrate 305 underneath the gate dielectric 316 is P type. Thus, the source/drain regions form PN junctions with the oppositely doped silicon substrate 305. Similarly, for the antifuse capacitor 320, if the gate 325 and source/drain respectively formed by doped regions 321, 324 and 322, 323 are N type, the region of the substrate 305 underneath the gate dielectric 326 is P type.

The doped regions 311, 312 and 321, 322 are lightly doped, wherein the electrically active concentration of dopant level can be in a range of $3\times10^{17} \sim 1\times10^{19}$ atoms/cm$^{-3}$. The doped regions 313, 314 and 323, 324 formed on both sides of the channels are deeply doped, wherein the electrically active concentration of dopant level can be above $2 \times 10^{19}$ atoms/cm$^{-3}$.

Doped regions of 313, 312 are connected, and they are electrically conductive. Similarly, doped regions 311, 314, 324, and 321 are connected, and they are electrically conductive. Doped regions 322, 323 are also connected. During antifuse programming, a voltage is applied on the gate 315 to turn on the select transistor 310, i.e., to form a conductive channel in the substrate 305 underneath the gate dielectric 316. In the meantime, a programming voltage is applied to the doped region 313. Through the conductive path underneath the gate dielectric 316, the programming voltage is actually applied on the gate dielectric 326 to cause a dielectric breakdown. A low electrical resistance will be measured between the gate 325 and the doping region 324 or between the gate 325 and doping region 323.

The gate 315 and the gate dielectric 316 in the select transistor 310 support a high-voltage device for high programming yield. The doped regions 311/314 and 312/313 form low-voltage (LV) junctions with the substrate 305 for the select transistor 310. These low voltage junctions can reduce the foot print of the antifuse OTP memory cell 300. The breakdown threshold voltage for LV junctions can be lower than 3.2V, or below 2.3V depending on technology node of the device.

An important aspect of the antifuse OTP memory cell 300 is that it includes a hybrid antifuse capacitor with low-voltage device and high-voltage junctions and a hybrid select transistor with high-voltage device and low-voltage junctions. Comparing to the antifuse OTP memory cell 100 (FIGS. 1A-1B), the select transistor 310 with low-voltage junctions can effectively reduce memory cell area and increase memory density.

Figure 3C:
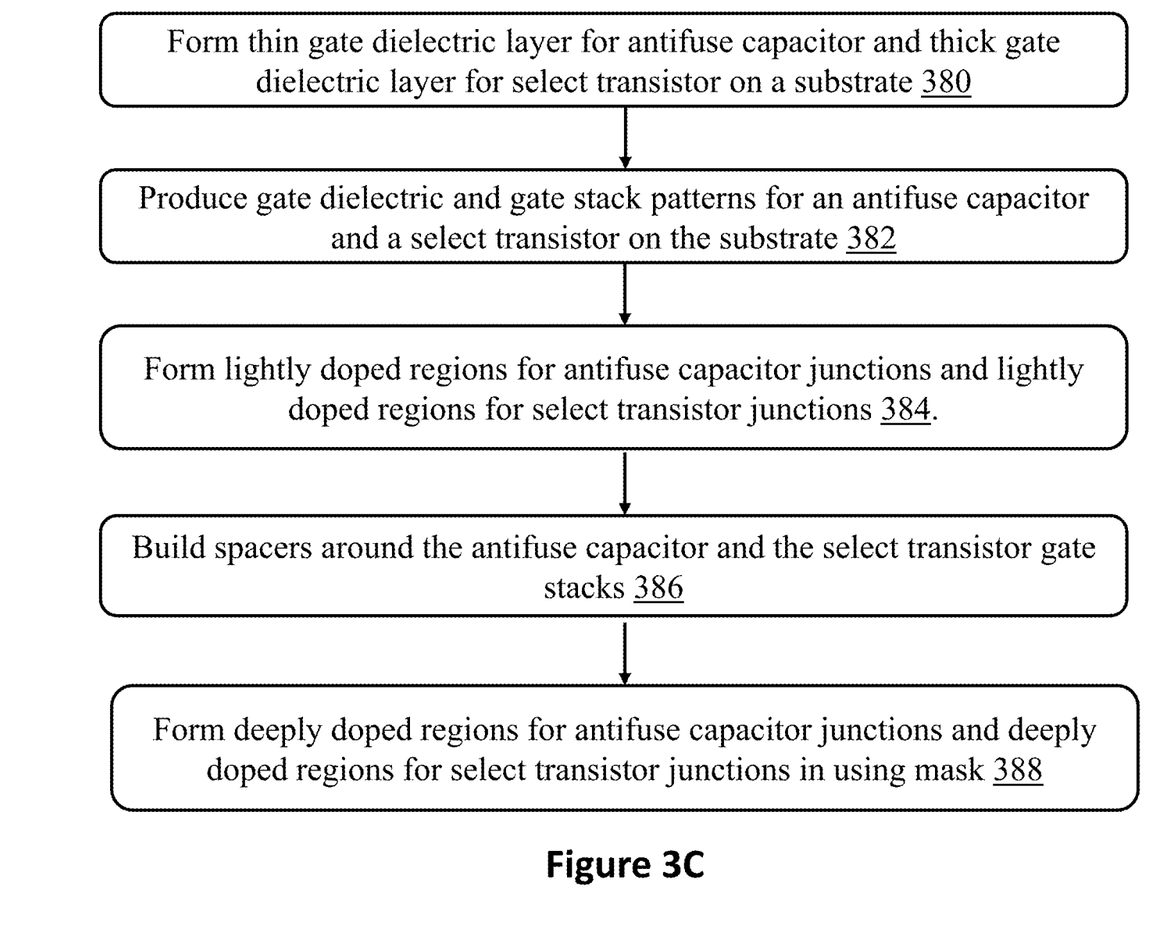
FIG. 3C is a process flow chart to build the antifuse OTP memory cell shown in FIG. 3A.

Referring to FIG. 3C, a process to build the one-transistor one-capacitor (1T1C) antifuse OTP memory cell 300 can include the following steps. First, a thin gate dielectric layer for antifuse capacitor and a thick gate dielectric layer for select transistor is formed on a substrate (step 380). Gate dielectric and gate stack patterns are then produced for an antifuse capacitor and a select transistor on the substrate (step 382). These can be accomplished using masking and etching techniques. A thin gate dielectric layer is formed on the substrate for the antifuse capacitor and a thicker gate dielectric layer is formed on the substrate for the select transistor respectively. Then, the gate stacks are formed on top of the gate dielectric layers. The antifuse capacitor and the select transistor are defined by masking and etching. The combination of lightly doped regions and deeply doped regions is formed by applying the spacer structures 317, 327 between two doping processes.

The relatively shallow doping regions (e.g. 311, 321 in FIGS. 3A and 3B) for the antifuse capacitor 320 and the relatively shallow doping regions (e.g. 312, 322 in FIGS. 3A and 3B) for the select transistor 310 are formed through a single masking and ion implants or separate masking and ion implants (step 384). Moreover, annealing steps may be added after dopant implant process.

Next, spacers are built around the antifuse capacitor stack and the select transistor gate stack (step 386). Deeply doped regions 313, 314 (FIGS. 3A and 3B) for the select transistor 310, and deeply doped regions 323, 324 (FIGS. 3A and 3B) for the antifuse capacitor 320 are formed in masking process and ion implant (step 388).

The above described only serves as examples of critical process steps to build an antifuse OTP memory cell shown in FIGS. 3A-3B. Additional process steps maybe included between processes steps described above, and other process steps are needed before and after the processes steps described above for building an entire device. For example, in steps 382-388, the source and drain junctions can be formed by ion implantation.

Figure 4A:
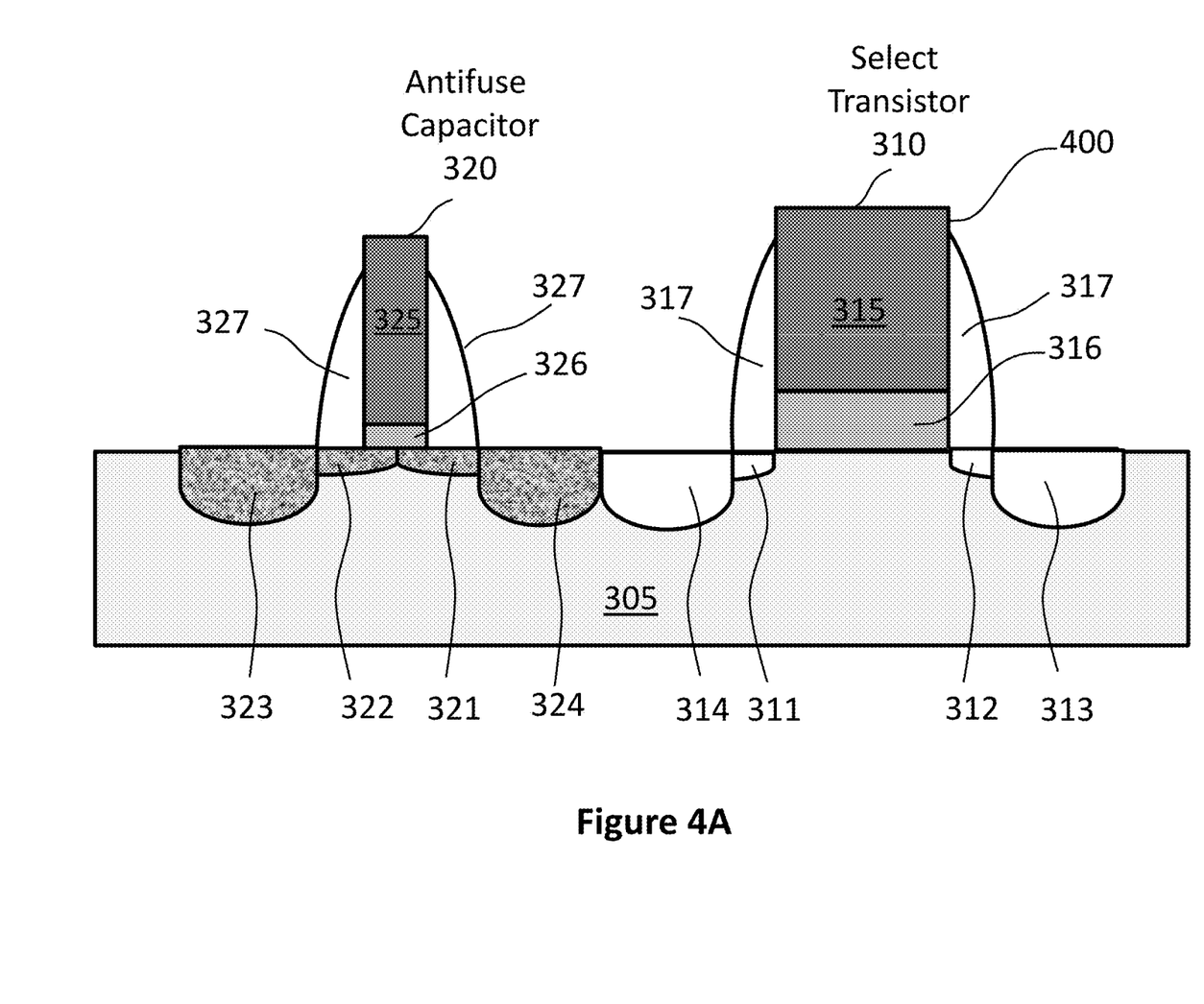
FIG. 4A is a cross-sectional view of another antifuse OTP memory cell related to the antifuse OTP memory cell in FIG. 3A.
Figure 4B:
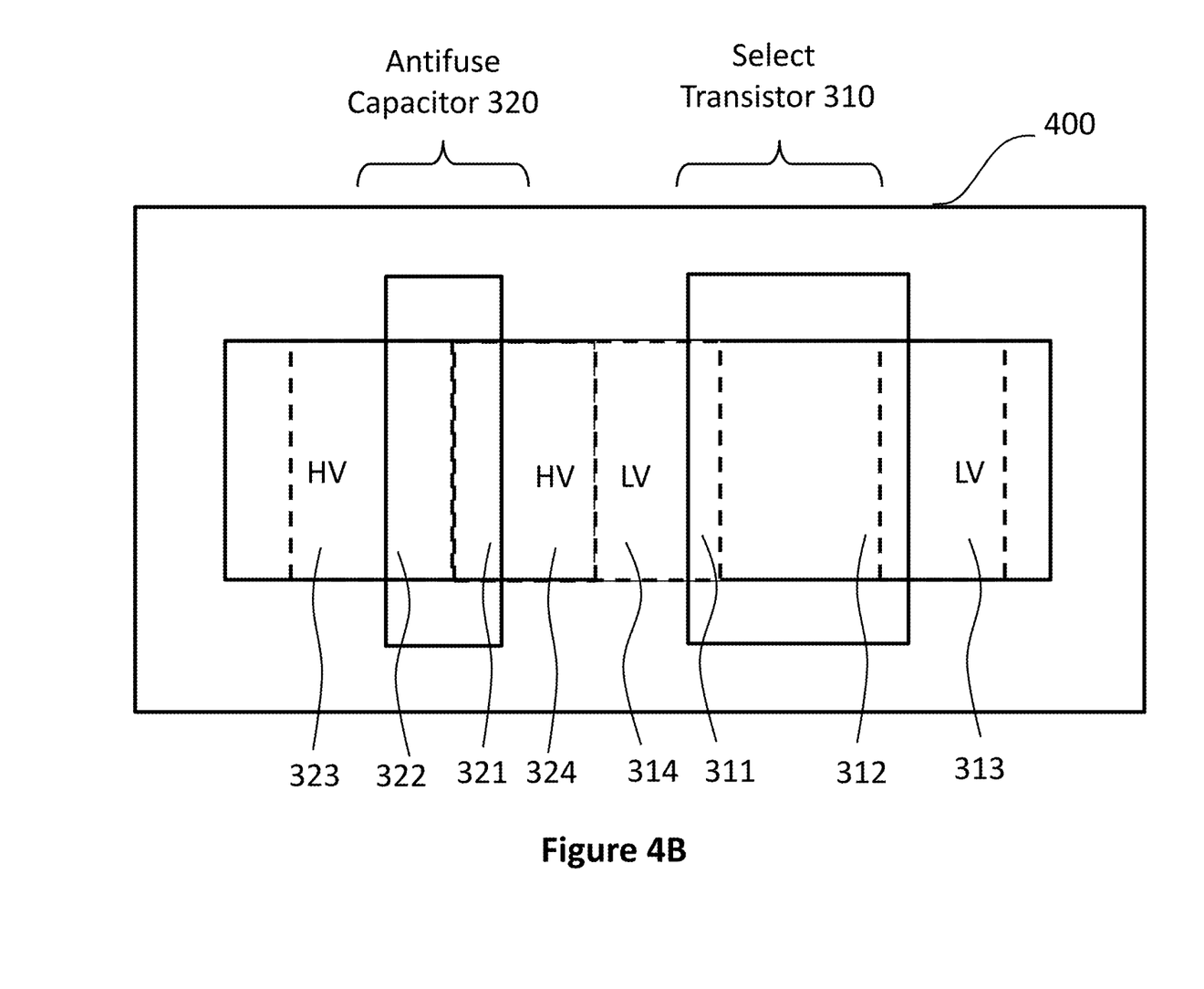
FIG. 4B is a schematic planar drawing of the antifuse OTP memory cell shown in FIG. 4A.

In some embodiments, referring to FIGS. 4A and 4B, an antifuse OTP memory cell 400 includes a select transistor 310 and an antifuse capacitor 320 and associated components, similar to the antifuse OTP memory cell 300 as described above in relation to FIGS. 3A and 3B. A difference from the antifuse OTP memory cell 300 is that the lightly doped regions 321, 322 in the antifuse OTP memory cell 400 are electrically connected instead of separated by a channel.

An antifuse is non-conductive in the native unprogrammed state and becomes conductive when programmed. Usually, a voltage is applied on the antifuse capacitor, e.g., between the deeply doped region 323 and gate 325 or between the deeply doped region 324 and gate 325. An electric current is measured to determine if the antifuse memory cell is programmed or not. However, if the lightly doped regions 321 and 322 are not connected in the substrate 305 underneath the gate oxide 326 (i.e. separated by the channel 330 shown in FIG. 3A), part of the electric current will leak into the substrate 305 through the channel 330 (FIG. 3A); the current measurement will not be stable. By merging the dopant area 321 and 322, the current leakage path into the substrate 305 is blocked, and current measurement noise can be effectively reduced.

The above description of the disclosed embodiments enables those skilled in the art to implement or use the present invention. Various modifications to these embodiments will be readily apparent to those skilled in the art, and the general principles defined herein may be applied to other embodiments without departing from the spirit or scope of the invention. Thus, the present invention will not be limited to the embodiments shown herein but will conform to the widest scope consistent with the principles and novel features disclosed herein.

What is claimed is:

1. An antifuse One-Time-Programmable memory cell, comprising:
   a substrate;
   a select transistor formed on the substrate, comprising:
   a first gate dielectric layer formed on the substrate;
   a first gate formed on the gate dielectric layer;
   a first high-voltage junction formed in the substrate; and
   a second high-voltage junction formed in the substrate,
   wherein a source and a drain for the select transistor are formed by the first high-voltage junction and the second high-voltage junction; and
   an antifuse capacitor formed on the substrate, comprising:
   a second gate dielectric layer formed on the substrate,
   a second gate formed on the gate dielectric layer;
   a third high-voltage junction formed in the substrate; and
   a fourth high-voltage junction formed in the substrate,
   wherein the third high-voltage junction and the fourth high-voltage junction of the antifuse capacitor are in direct physical contact with each other,
   wherein a source and a drain for the antifuse capacitor are respectively formed by the third high-voltage junction and the fourth high-voltage junction,
   wherein the second high-voltage junction and the third high-voltage junction are in direct physical contact with each other.

2. The antifuse One-Time-Programmable memory cell of claim 1, wherein the first high-voltage junction or the second high-voltage junction or the third high-voltage junction or the fourth high-voltage junction has a threshold junction breakdown voltage above 3.3 Volt.

3. The antifuse One-Time-Programmable memory cell of claim 2, wherein the first high-voltage junction or the second high-voltage junction or the third high-voltage junction or the fourth high-voltage junction has a threshold junction breakdown voltage above 5 Volt.

4. The antifuse One-Time-Programmable memory cell of claim 1, wherein the first high-voltage junction includes a first doped region adjacent to the first gate dielectric layer at a lower doped level than a second doped region away from the first gate dielectric layer.

5. The antifuse One-Time-Programmable memory cell of claim 1, wherein the second high-voltage junction includes a first doped region adjacent to the second gate dielectric layer at a lower doped level than a second doped region away from the second gate dielectric layer.

6. The antifuse One-Time-Programmable memory cell of claim 1, wherein the third high-voltage junction includes a first doped region adjacent to the first gate dielectric layer at a lower doped level than a second doped region away from the first gate dielectric layer.

7. The antifuse One-Time-Programmable memory cell of claim 1, wherein the fourth high-voltage junction includes a first doped region adjacent to the second gate dielectric layer at a lower doped level than a second doped region away from the second gate dielectric layer.

8. An antifuse One-Time-Programmable memory cell, comprising:
a substrate;
a select transistor formed on the substrate, comprising:
a first gate dielectric layer formed on the substrate;
a first gate formed on the gate dielectric layer;
a first low-voltage junction formed in the substrate; and
a second low-voltage junction formed in the substrate,
wherein a source and a drain for the select transistor are formed by the first low-voltage junction and the second low-voltage junction; and
an antifuse capacitor formed on the substrate, comprising:
a second gate dielectric layer formed on the substrate;
a second gate formed on the gate dielectric layer;
a first high-voltage junction formed in the substrate; and
a second high-voltage junction formed in the substrate,
wherein a source and a drain for the antifuse capacitor are respectively formed by the first high-voltage junction and the second high-voltage junction,
wherein the first high-voltage junction or the second high-voltage junction has a first threshold junction breakdown voltage above a second threshold junction breakdown voltage of the first low-voltage junction or the second low-voltage junction.

9. The antifuse One-Time-Programmable memory cell of claim 8, wherein the first high-voltage junction and the second high-voltage junction of the antifuse capacitor are separated by a channel in the substrate.

10. The antifuse One-Time-Programmable memory cell of claim 8, wherein the first high-voltage junction and the second high-voltage junction of the antifuse capacitor are in direct physical contact with each other.

11. The antifuse One-Time-Programmable memory cell of claim 8, wherein the first high-voltage junction or the second high-voltage junction has a threshold junction breakdown voltage above 3.3 Volt.

12. The antifuse One-Time-Programmable memory cell of claim 11, wherein the first high-voltage junction or the second high-voltage junction has a threshold junction breakdown voltage above 5 Volt.

13. The antifuse One-Time-Programmable memory cell of claim 8, wherein the first low-voltage junction or the second low-voltage junction has a threshold junction breakdown voltage below 3.2 Volt.

14. The antifuse One-Time-Programmable memory cell of claim 8, wherein the first high-voltage junction includes a first doped region adjacent to the first gate dielectric layer at a lower doped level than a second doped region away from the first gate dielectric layer.

15. The antifuse One-Time-Programmable memory cell of claim 8, wherein the second high-voltage junction includes a first doped region adjacent to the second gate dielectric layer at a lower doped level than a second doped region away from the second gate dielectric layer.

16. The antifuse One-Time-Programmable memory cell of claim 8, wherein the first low-voltage junction includes a first doped region adjacent to the first gate dielectric layer at a lower doped level than a second doped region away from the first gate dielectric layer.

17. The antifuse One-Time-Programmable memory cell of claim 8, wherein the second low-voltage junction includes a first doped region adjacent to the second gate dielectric layer at a lower doped level than a second doped region away from the second gate dielectric layer.

18. The antifuse One-Time-Programmable memory cell of claim 8, wherein the second high-voltage junction and the first low-voltage junction are in direct physical contact with each other.

* * * * *